(12) United States Patent
Satou

(10) Patent No.: US 7,940,122 B2
(45) Date of Patent: May 10, 2011

(54) AMPLIFIER CIRCUIT AND COMMUNICATION DEVICE

(75) Inventor: Hiroyuki Satou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/183,551

(22) Filed: Jul. 31, 2008

(65) Prior Publication Data
US 2009/0066418 A1   Mar. 12, 2009

(30) Foreign Application Priority Data

Sep. 7, 2007   (JP) .................................. 2007-232605

(51) Int. Cl.
H03G 3/00   (2006.01)
(52) U.S. Cl. ......................... 330/282; 330/291; 330/253
(58) Field of Classification Search .................. 330/282, 330/291, 253
See application file for complete search history.

(56) References Cited

U.S. PATENT DOCUMENTS

| | | | | |
|---|---|---|---|---|
| 5,296,696 A | * | 3/1994 | Uno | ........................... 250/208.1 |
| 5,322,994 A | * | 6/1994 | Uno | ........................... 250/208.1 |
| 5,440,276 A | * | 8/1995 | Kim | ........................ 331/117 FE |
| 5,590,412 A | * | 12/1996 | Sawai et al. | ...................... 455/82 |
| 6,359,521 B1 | * | 3/2002 | Nakano et al. | ............. 331/117 R |
| 6,424,222 B1 | | 7/2002 | Jeong et al. | |
| 6,480,066 B1 | | 11/2002 | Madni | |
| 6,657,498 B2 | | 12/2003 | Park et al. | |
| 2002/0190796 A1 | | 12/2002 | Park et al. | |
| 2009/0033440 A1 | * | 2/2009 | Masuda et al. | ................. 333/215 |

FOREIGN PATENT DOCUMENTS

| | | |
|---|---|---|
| JP | 61-21120 U | 2/1986 |
| JP | 63-027104 A | 2/1988 |
| JP | 9-246880 | 9/1997 |
| JP | 2001-203544 A | 7/2001 |
| JP | 2003-008375 A | 1/2003 |
| JP | 2004-128704 A | 4/2004 |
| JP | 2004-159195 | 6/2004 |
| JP | 2004-522350 A | 7/2004 |
| JP | 2005-312016 A | 11/2005 |
| JP | 2006-245843 A | 9/2006 |

OTHER PUBLICATIONS

"Japanese Office Action" mailed by JPO and corresponding to Japanese application No. 2007-232605 on Mar. 9, 2010.

* cited by examiner

*Primary Examiner* — Patricia Nguyen
(74) *Attorney, Agent, or Firm* — Fujitsu Patent Center

(57) ABSTRACT

There is provided an amplifier circuit having a common-source amplifier, an output load connected to an output terminal of the common-source amplifier, a buffer circuit connected to the output terminal of the common-source amplifier, a feedback circuit connected between an output terminal of the buffer circuit and an input terminal of the common-source amplifier, and a control circuit for controlling an impedance of the feedback circuit in accordance with a gain of the common-source amplifier.

8 Claims, 5 Drawing Sheets

F I G. 1
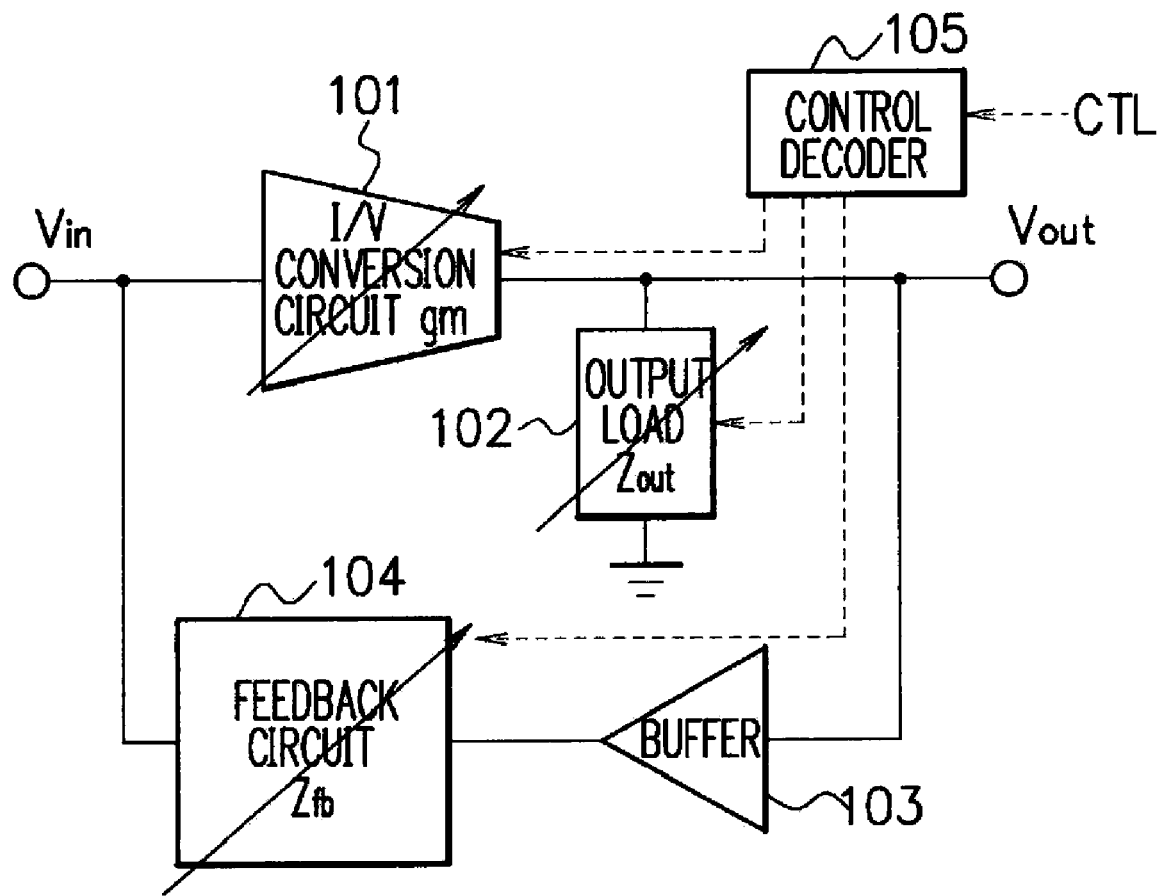

| CTL | TARGET GAIN | Zout | Zfb |
|---|---|---|---|
| a | gm·R1 | R1 | Rfb1=gm·Zin·R1 |
| b | gm·R2 | R2 | Rfb2=gm·Zin·R2 |
| c | gm·R3 | R3 | Rfb3=gm·Zin·R3 |
| d | gm·R4 | R4 | Rfb4=gm·Zin·R4 |
| e | gm·R5 | R5 | Rfb5=gm·Zin·R5 |

| CTL | TARGET GAIN | Zout | Zfb |
|---|---|---|---|
| a | $g_m \cdot L/rC_1$ | $L/rC_1$ | $R_{fb1} = g_m \cdot Z_{in} \cdot L/rC_1$ |
| b | $g_m \cdot L/rC_2$ | $L/rC_2$ | $R_{fb2} = g_m \cdot Z_{in} \cdot L/rC_2$ |
| c | $g_m \cdot L/rC_3$ | $L/rC_3$ | $R_{fb3} = g_m \cdot Z_{in} \cdot L/rC_3$ |
| d | $g_m \cdot L/rC_4$ | $L/rC_4$ | $R_{fb4} = g_m \cdot Z_{in} \cdot L/rC_4$ |
| e | $g_m \cdot L/rC_5$ | $L/rC_5$ | $R_{fb5} = g_m \cdot Z_{in} \cdot L/rC_5$ |

| CTL | TARGET GAIN | gm | $Z_{fb}$ |
|---|---|---|---|
| a | $gm1 \cdot Z_{out}$ | $gm1$ | $R_{fb1} = gm1 \cdot Z_{in} \cdot Z_{out}$ |
| b | $gm2 \cdot Z_{out}$ | $gm2$ | $R_{fb2} = gm2 \cdot Z_{in} \cdot Z_{out}$ |
| c | $gm3 \cdot Z_{out}$ | $gm3$ | $R_{fb3} = gm3 \cdot Z_{in} \cdot Z_{out}$ |
| d | $gm4 \cdot Z_{out}$ | $gm4$ | $R_{fb4} = gm4 \cdot Z_{in} \cdot Z_{out}$ |
| e | $gm5 \cdot Z_{out}$ | $gm5$ | $R_{fb5} = gm5 \cdot Z_{in} \cdot Z_{out}$ |

AMPLIFIER CIRCUIT AND COMMUNICATION DEVICE

CROSS-REFERENCE TO RELATED APPLICATIONS

This application is based upon and claims the benefit of priority from the prior Japanese Patent Application No. 2007-232605, filed on Sep. 7, 2007, the entire contents of which are incorporated herein by reference.

BACKGROUND OF THE INVENTION

1. Field of the Invention

The present invention relates to an amplifier circuit and a communication device.

2. Description of the Related Art

In an architecture of a radio receiver, since an input signal is low, an amplifier for amplifying the signal is required in the first stage. Generally, the noise is generated from the electric circuit. If the noise level generated from the circuit is large, the signal to noise ratio becomes small. Therefore, the amplifier with a small noise generated from the circuit is requested. The larger a gain of the amplifier becomes, the more effective it is for lowering the equivalent input noise. As an amplifier structured to have a large gain, a common-source amplifier is generally used.

Input impedance of the common-source amplifier is high. In the architecture of the radio receiver, it is required not only to lower the noise but also to match the input impedance with an impedance of an antenna and transmit a signal being incident from the antenna to the amplifier at the maximum (impedance matching).

Further, the low-noise amplifier generally requires a variable gain function since there is a need to stabilize the gain and send the signal to a circuit (mixer) at a later stage.

FIG. 8 is a block diagram showing a structural example of a low-noise amplifier, and FIG. 9 is a circuit diagram showing a structural example of a low-noise amplifier in which a common-source amplifier is used. A voltage controlled current circuit 801 being a common-source amplifier composed of cascode-connected field effect transistors 901 and 902, converts an input voltage Vin into a current and outputs it. An output load 802 converts the current converted in the voltage controlled current circuit 801 into an output voltage Vout. A buffer 803 has a field effect transistor 903 and a current source 904, and feedbacks the output voltage Vout to a terminal of the input voltage Vin via a feedback circuit (element) 804.

An input impedance Zin of the low-noise amplifier can be represented by the following formula. Here, "Zfb" is an impedance of the feedback circuit 804, "gm" is a transconductance of the field effect transistor 901, and "Zout" is an impedance of the output load 802.

$$Zin = Zfb / \{1 + (gm \times Zout)\} \quad (1)$$

Here, when a formula of $gm \times Zout \gg 1$ is satisfied, the formula (1) can be represented by a formula (2).

$$Zin = Zfb / (gm \times Zout) \quad (2)$$

The input impedance Zin is determined by the transconductance gm, the impedance Zout of the output load, and the impedance Zfb of the feedback circuit 804.

Japanese Patent Application Laid-open No. 2004-159195 discloses an amplifier circuit provided with a common-source transistor which amplifies a signal being input into a gate terminal and outputs it from a drain terminal, a load resistance connected to the drain terminal of the common-source transistor, an inductor connected in series with the load resistance, and a feedback resistance connected between the drain terminal and the gate terminal of the common-source transistor.

Further, Japanese Patent Application Laid-open No. Hei 9-246880 discloses an amplifier circuit having a common-source amplifier circuit composed of a first transistor which performs a signal amplification and a first active load formed of an FET, a source follower circuit composed of a second transistor which inputs a drain output signal of the first transistor and a first current source, a feedback resistance connecting an output terminal of the source follower circuit and an input terminal of the common-source amplifier circuit, a capacitance connecting the input terminal of the common-source amplifier circuit and a gate terminal of the FET composing the active load, and an impedance element connecting the gate terminal of the FET composing the active load and a power supply.

The variable gain function is provided in circuits shown in FIG. 8 and FIG. 9, so that when the transconductance gm of the transistor 901 is changed or when the output load 802 has a frequency dependency, and the like, a denominator of the aforementioned formula (2) is changed, resulting that the input impedance Zin cannot be kept constant in these circuits. Accordingly, a mismatch between the input impedance Zin and the impedance of the antenna is generated and, consequently, it becomes impossible to transmit the signal sufficiently.

SUMMARY OF THE INVENTION

An amplifier circuit of the present invention is provided with a common-source amplifier, an output load connected to an output terminal of the common-source amplifier, a buffer circuit connected to the output terminal of the common-source amplifier, a feedback circuit connected between an output terminal of the buffer circuit and an input terminal of the common-source amplifier, and a control circuit for controlling an impedance of the feedback circuit in accordance with a gain of the common-source amplifier.

BRIEF DESCRIPTION OF THE DRAWINGS

FIG. 1 is a block diagram showing a structural example of an amplifier circuit according to a first embodiment of the present invention;

DETAILED DESCRIPTION OF THE PREFERRED EMBODIMENTS

Figures 2, 3:
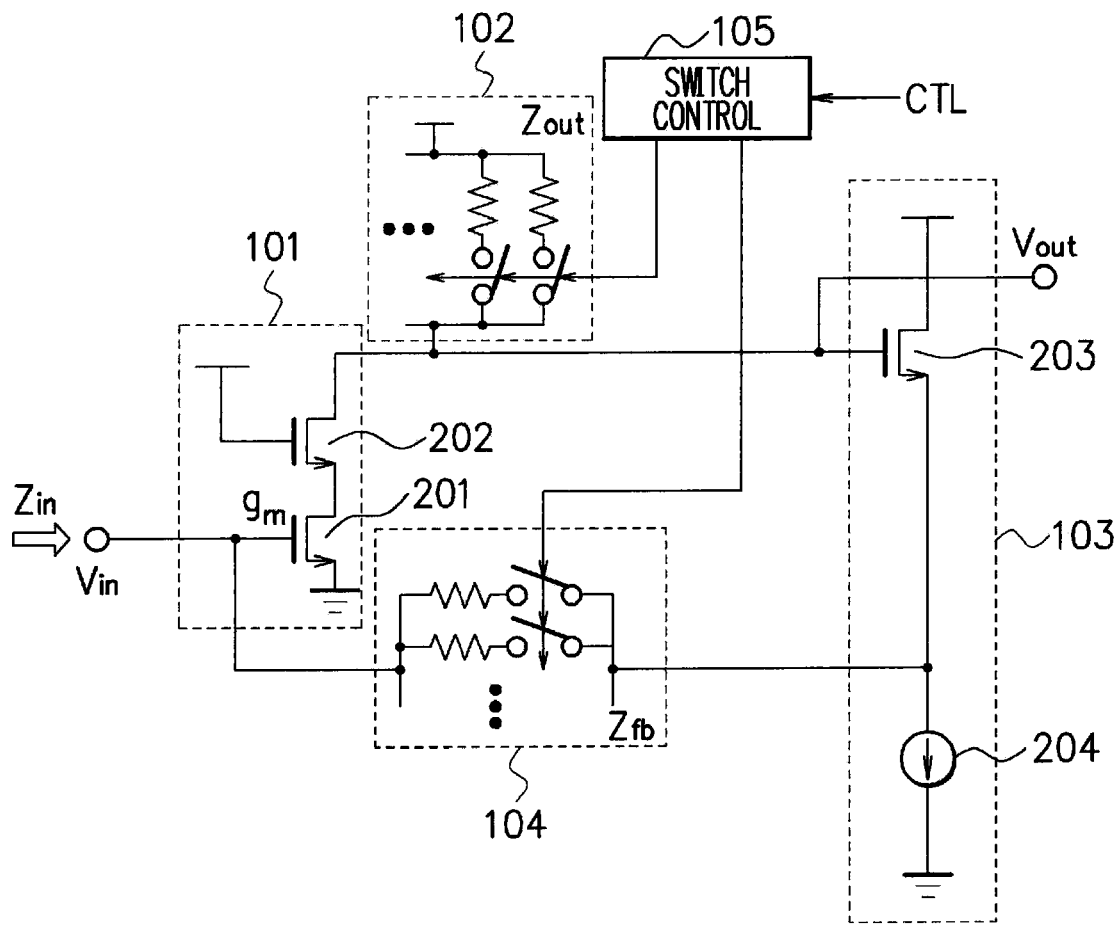
FIG. 2 is a circuit diagram showing a structural example of an amplifier circuit according to a second embodiment of the present invention.
FIG. 3 is a view indicating target gains, impedances of an output load, and impedances of a feedback circuit in the amplifier circuit according to the second embodiment.

FIG. 1 is a block diagram showing a structural example of an amplifier circuit according to a first embodiment of the present invention. This amplifier circuit is a high-frequency low-noise amplifier circuit used in a radio receiver, for example. An antenna is connected to a terminal of an input voltage Vin.

The terminal of the input voltage Vin is connected to an input terminal of a voltage controlled current circuit 101. The voltage controlled current circuit 101 being a common-source amplifier having an input terminal and an output terminal respectively connected to the terminal of the input voltage Vin and a terminal of an output voltage Vout, converts the input voltage Vin into a current to output it. An output load 102 is connected to the output terminal of the voltage controlled current circuit 101, and converts the current being output from the voltage controlled current circuit 101 into the output voltage Vout. A buffer circuit 103 is connected to the output terminal of the voltage controlled current circuit 101. A feedback circuit (element) 104 is connected between an output terminal of the buffer circuit 103 and the input terminal of the voltage controlled current circuit 101.

The voltage controlled current circuit 101 has a variable transconductance gm inside thereof. The output load 102 has a variable impedance Zout inside thereof. The feedback circuit 104 has a variable impedance Zfb inside thereof. A control decoder 105 controls the transconductance gm of the voltage controlled current circuit 101, the impedance Zout of the output load 102 and/or the impedance Zfb of the feedback circuit 104 in accordance with a control signal CTL.

An input impedance Zin of the amplifier circuit is represented by the aforementioned formula (1), and is approximated by the aforementioned formula (2). A gain of the amplifier circuit is represented by a formula of gm×Zout. AS indicated in the formula (2), when the impedance Zout of the output load 102 is varied, by changing the impedance Zfb of the feedback circuit 104 as much as the variation amount of the impedance Zout of the output load 102, an input impedance Zin which is constant all the time can be obtained. The amplifier circuit changes the impedance Zfb of the feedback circuit 104 in accordance with the impedance Zout of the output load 102 so that the input impedance Zin does not vary due to the variation of the impedance Zout of the output load 102.

In like manner, when the transconductance gm of the voltage controlled current circuit 101 is varied, by controlling the impedance Zfb of the feedback circuit 104, it is possible to obtain the input impedance Zin that is constant all the time.

If the gain of the amplifier circuit is taken into consideration, the input impedance Zin can be kept constant all the time. Accordingly, an unnecessary (or unintended) decrease in signal strength due to the mismatch of the input impedance Zin can be prevented. By performing the impedance matching, it is possible to prevent a reflection of the input signal, resulting that the decrease in strength of the input signal can be prevented. This provides a great benefit to the radio receiver since the unnecessary decrease in signal strength affects a noise characteristic, too.

FIG. 2 is a circuit diagram showing a structural example of an amplifier circuit according to a second embodiment of the present invention, in which a concrete circuit structure example of the first embodiment is shown. A voltage controlled current circuit 101 is a common-source amplifier having a first n-channel field effect transistor 201 and a second n-channel field effect transistor 202. The transistors 201 and 202 are cascade-connected (serially connected). The transistor 201 having a transconductance gm has a source, a gate, and a drain respectively connected to a reference potential (ground potential), a terminal of the input voltage Vin, and a source of the transistor 202. The transistor 202 has a gate and a drain respectively connected to the power supply voltage and a terminal of the output voltage Vout.

The buffer circuit 103 has an n-channel field effect transistor 203 and a current source 204. The transistor 203 has a source, a gate, and a drain respectively connected to the reference potential (ground potential) via the current source 204, the terminal of the output voltage Vout, and the power supply voltage.

The output load 102 is connected between the terminal of the output voltage Vout and the power supply voltage, in which a plurality of series-connected circuits each composed of a resistance and a switch are connected in parallel. The feedback circuit 104 is connected between the source of the transistor 203 and the terminal of the input voltage Vin, in which a plurality of series-connected circuits each composed of a resistance and a switch are connected in parallel.

FIG. 3 is a view indicating target gains, impedances Zout of the output load 102, and impedances Zfb of the feedback circuit 104 in the amplifier circuit according to the present embodiment. The target gain is represented by a formula of gm×Zout.

A switch control circuit (control decoder) 105 controls ON/OFF of the switches in the output load 102 and the switches in the feedback circuit 104 according to the control signal CTL for selecting the gain. The impedance Zout of the output load 102 is changed to either a resistance R1, R2, R3, R4, or R5, according to the number of switches being turned on inside the output load 102. Similarly, the impedance Zfb of the feedback circuit 104 is changed to either a resistance Rfb1, Rfb2, Rfb3, Rfb4, or Rfb5, according to the number of switches being turned on inside the feedback circuit 104.

When the gain control signal CTL is "a", the target gain is controlled to be a value represented by a formula of gm×R1, the impedance Zout of the output load 102 is controlled to be the resistance R1, and the impedance Zfb of the feedback circuit 104 is controlled to be the resistance Rfb1. By setting the resistance Rfb1 to a value represented by a formula of gm×Zin×R1, the input impedance Zin can be kept constant.

When the gain control signal CTL is "b", the target gain is controlled to be a value represented by a formula of gm×R2, the impedance Zout of the output load 102 is controlled to be the resistance R2, and the impedance Zfb of the feedback circuit 104 is controlled to be the resistance Rfb2. By setting the resistance Rfb2 to a value represented by a formula of gm×Zin×R2, the input impedance Zin can be kept constant.

When the gain control signal CTL is "c", the target gain is controlled to be a value represented by a formula of gm×R3, the impedance Zout of the output load 102 is controlled to be the resistance R3, and the impedance Zfb of the feedback circuit 104 is controlled to be the resistance Rfb3. By setting the resistance Rfb3 to a value represented by a formula of gm×Zin×R3, the input impedance Zin can be kept constant.

When the gain control signal CTL is "d", the target gain is controlled to be a value represented by a formula of gm×R4, the impedance Zout of the output load 102 is controlled to be the resistance R4, and the impedance Zfb of the feedback circuit 104 is controlled to be the resistance Rfb4. By setting the resistance Rfb4 to a value represented by a formula of gm×Zin×R4, the input impedance Zin can be kept constant.

When the gain control signal CTL is "e", the target gain is controlled to be a value represented by a formula of gm×R5, the impedance Zout of the output load 102 is controlled to be the resistance R5, and the impedance Zfb of the feedback circuit 104 is controlled to be the resistance Rfb5. By setting the resistance Rfb5 to a value represented by a formula of gm×Zin×R5, the input impedance Zin can be kept constant.

As described above, the amplifier circuit of the present embodiment has the gain variable function. Elements of the impedance Zout and the impedance Zfb are composed of variable resistors formed of LSIs and capable of being mounted relatively easily. The transconductance of the transistor 201 of the common-source amplifier is set as gm. In the variable resistor element, series-connected resistor element and switch (transistor) combinations are connected in parallel. Subsequently, a gate bias of the respective switch (transistor) is connected to the switch control circuit 105.

The gain of this amplifier circuit is represented by the formula of gm×Zout, and is controlled by varying the impedance (resistance) Zout. At this time, the switch control circuit 105 provides a relationship as shown in FIG. 3 based on the formula (2). As such, by providing a relationship between the impedance (resistance) Zout of the output load 102 and the impedance (resistance) Zfb of the feedback circuit 104, it is possible to keep the input impedance Zin constant all the time. Accordingly, even when the gain is changed, it is possible to keep the input impedance Zin constant, and to prevent the attenuation of the strength of the input signal.

Figures 4, 5:
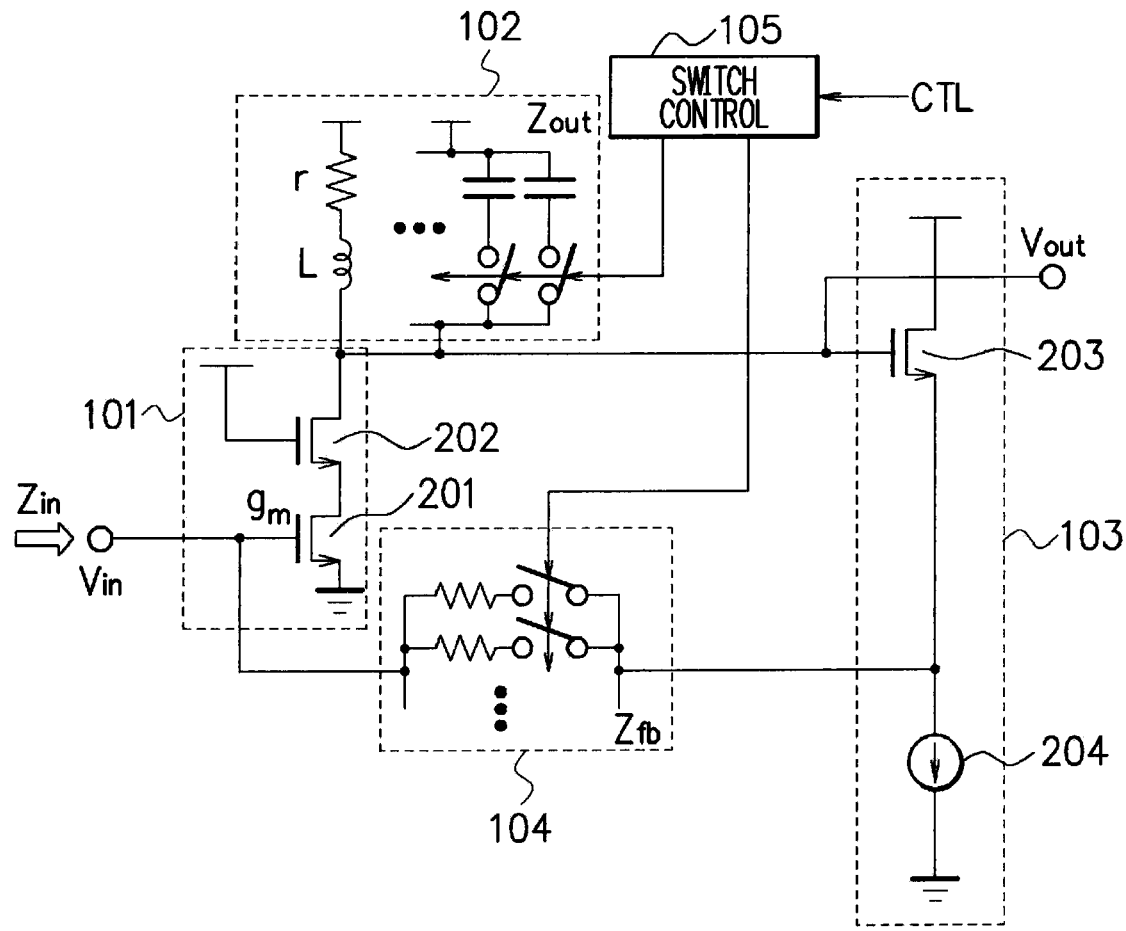
FIG. 4 is a circuit diagram showing a structural example of an amplifier circuit according to a third embodiment of the present invention.
FIG. 5 is a view indicating target gains, impedances of an output load, and impedances of a feedback circuit in the amplifier circuit according to the third embodiment.

FIG. 4 is a circuit diagram showing a structural example of an amplifier circuit according to a third embodiment of the present invention, in which the concrete circuit structure example of the first embodiment is shown. What differs between the present embodiment (FIG. 4) and the second embodiment (FIG. 2) is the output load 102. Except that point, the present embodiment takes the same structure as that of the second embodiment. Hereinafter, a point where the present embodiment differs from the second embodiment will be explained.

The output load 102 connected between the terminal of the output voltage Vout and the power supply voltage has a circuit having a plurality of series-connected circuits of capacitances and switches being connected in parallel, and a series-connected circuit of an inductor L and a resistance r.

FIG. 5 is a view indicating target gains, impedances Zout of the output load 102, and impedances Zfb of the feedback circuit 104 in the amplifier circuit according to the present embodiment. The target gain is represented by a formula of gm×Zout.

The switch control circuit (control decoder) 105 controls ON/OFF of the switches in the output load 102 and the switches in the feedback circuit 104 according to the control signal CTL for selecting the gain and a frequency. The impedance Zout of the output load 102 is changed according to the number of switches being turned on inside the output load 102. A capacitive component of the output load 102 is changed to either a capacitance value C1, C2, C3, C4, or C5, according to the control signal CTL. Similarly, the impedance Zfb of the feedback circuit 104 is changed according to the number of switches being turned on inside the feedback circuit 104.

When the gain control signal CTL is "a", the target gain is controlled to be a value represented by a formula of gm×L/(r×C1), the impedance Zout of the output load 102 is controlled to be a value represented by a formula of L/(r×C1), and the impedance Zfb of the feedback circuit 104 is controlled to be a resistance Rfb1. By setting the resistance Rfb1 to a value represented by a formula of gm×Zin×L/(r×C1), the input impedance Zin can be kept constant.

When the gain control signal CTL is "b", the target gain is controlled to be a value represented by a formula of gm×L/(r×C2), the impedance Zout of the output load 102 is controlled to be a value represented by a formula of L/(r×C2), and the impedance Zfb of the feedback circuit 104 is controlled to be a resistance Rfb2. By setting the resistance Rfb2 to a value represented by a formula of gm×Zin×L/(r×C2), the input impedance Zin can be kept constant.

When the gain control signal CTL is "c", the target gain is controlled to be a value represented by a formula of gm×L/(r×C3), the impedance Zout of the output load 102 is controlled to be a value represented by a formula of L/(r×C3), and the impedance Zfb of the feedback circuit 104 is controlled to be a resistance Rfb3. By setting the resistance Rfb3 to a value represented by a formula of gm×Zin×L/(r×C3), the input impedance Zin can be kept constant.

When the gain control signal CTL is "d", the target gain is controlled to be a value represented by a formula of gm×L/(r×C4), the impedance Zout of the output load 102 is controlled to be a value represented by a formula of L/(r×C4), and the impedance Zfb of the feedback circuit 104 is controlled to be a resistance Rfb4. By setting the resistance Rfb4 to a value represented by a formula of gm×Zin×L/(r×C4), the input impedance Zin can be kept constant.

When the gain control signal CTL is "e", the target gain is controlled to be a value represented by a formula of gm×L/(r×C5), the impedance Zout of the output load 102 is controlled to be a value represented by a formula of L/(r×C5), and the impedance Zfb of the feedback circuit 104 is controlled to be a resistance Rfb5. By setting the resistance Rfb5 to a value represented by a formula of gm×Zin×L/(r×C5), the input impedance Zin can be kept constant.

In the present embodiment, by making the capacitance value of an LC resonance circuit of the output load 102 variable according to the selection signal CTL, a frequency band of a band-pass filter (BPF) is made to be variable, resulting that the frequency band can be widen. In this case, the output load 102 has a frequency dependence. For the variable capacitor, as same as the variable capacitor used in the second embodiment, the one having combinations of capacitances and switches being connected in parallel is used. Also in this circuit structure, by providing a relationship as shown in FIG. 5 based on the formula (2), when either of the control signals CTL is selected, it is possible to keep the input impedance Zin constant. Accordingly, even when the gain and the frequency band of the band-pass filter are changed, it is possible to keep the input impedance Zin constant, and to prevent the attenuation of the strength of the input signal.

Note that it is also possible to vary an inductance of the output load 102, instead of varying its resistance value or capacitance value. In such a case, similarly as described above, series-connected circuits of inductors and switches are connected in parallel.

Figures 6, 7:
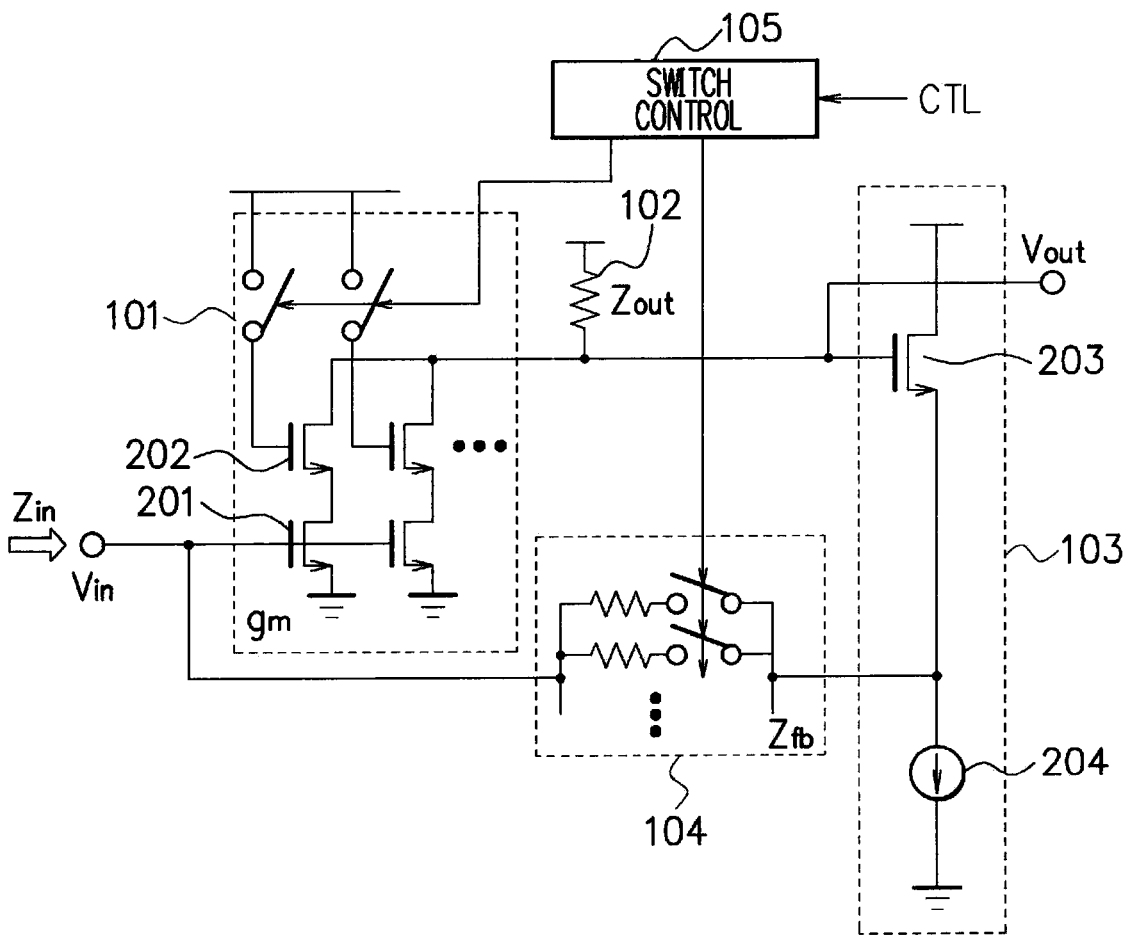
FIG. 6 is a circuit diagram showing a structural example of an amplifier circuit according to a fourth embodiment of the present invention.
FIG. 7 is a view indicating target gains, transconductances of a voltage controlled current circuit (common-source amplifier), and impedances of a feedback circuit in the amplifier circuit according to the fourth embodiment.
Figure 8:
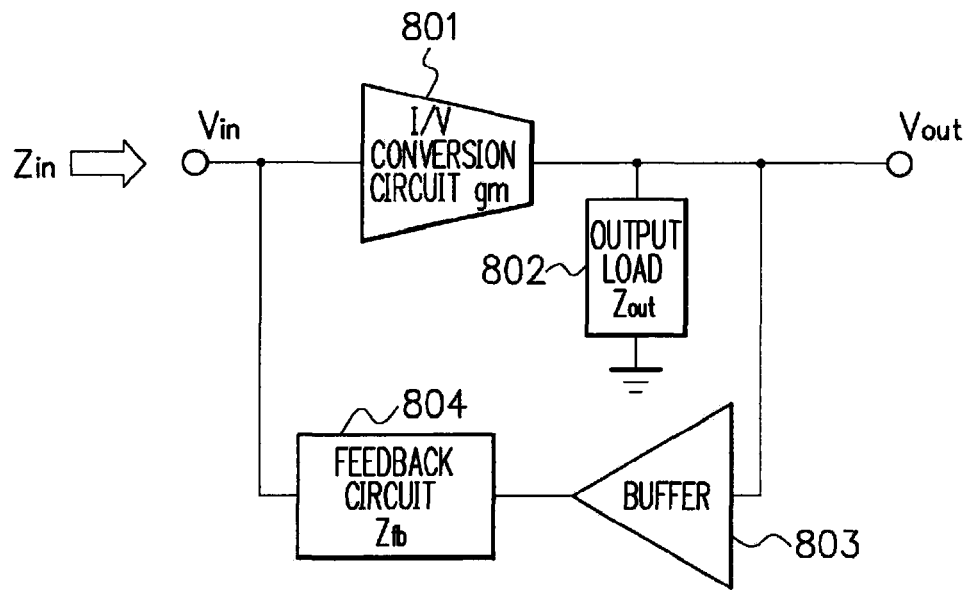
FIG. 8 is a block diagram showing a structural example of a low-noise amplifier.
Figure 9:
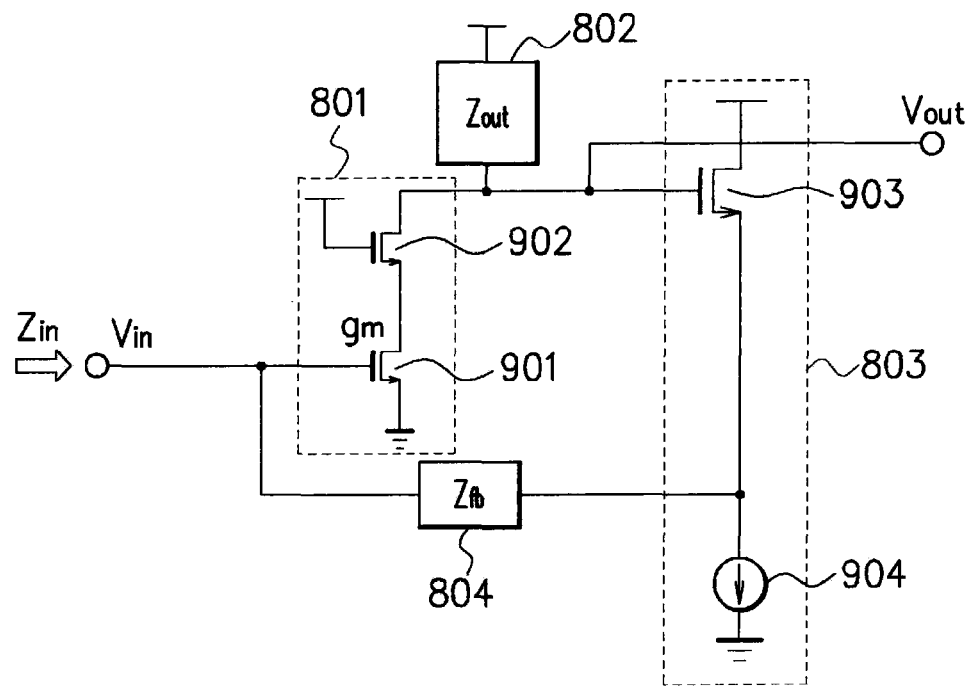
FIG. 9 is a circuit diagram showing a structural example of a low-noise amplifier in which a common-source amplifier is used.

FIG. 6 is a circuit diagram showing a structural example of an amplifier circuit according to a fourth embodiment of the present invention, in which the concrete circuit structure example of the first embodiment is shown. What differs between the present embodiment (FIG. 6) and the second embodiment (FIG. 2) are the voltage controlled current circuit 101 and the output load 102. Except that point, the present embodiment takes the same structure as that of the second embodiment. Hereinafter, a point where the present embodiment differs from the second embodiment will be explained.

The output load 102 has a fixed impedance (resistance) Zout connected between the terminal of the output voltage Vout and the power supply voltage. The voltage controlled current circuit 101 is structured by connecting a plurality of sets of the voltage controlled current circuits 101 shown in FIG. 2 in parallel. The first n-channel field effect transistor 201 and the second n-channel field effect transistor 202 are cascade-connected (serially connected) between the terminal of the output voltage Vout and the reference potential (ground potential). A switch is connected between a gate of the transistor 202 and the power supply voltage. A plurality of sets of the transistors 201, the transistors 202 and the switches are connected in parallel.

FIG. 7 is a view indicating target gains, transconductances gm of the voltage controlled current circuit (common-source amplifier) 101, and impedances Zfb of the feedback circuit 104 in the amplifier circuit according to the present embodiment. The target gain is represented by a formula of gm×Zout.

The switch control circuit (control decoder) 105 controls ON/OFF of the switches in the voltage controlled current circuit 101 and the switches in the feedback circuit 104 according to the control signal CTL for selecting the gain. The transconductance gm of the voltage controlled current circuit (common-source amplifier) 101 is changed to either gm1, gm2, gm3, gm4, or gm5, according to the number of switches being turned on inside the voltage controlled current circuit 101. Similarly, the impedance Zfb of the feedback circuit 104 is changed according to the number of switches being turned on inside the feedback circuit 104.

When the gain control signal CTL is "a", the target gain is controlled to be a value represented by a formula of gm1×Zout, the transconductance gm of the voltage controlled current circuit (common-source amplifier) 101 is controlled to be gm1, and the impedance Zfb of the feedback circuit 104 is controlled to be a resistance Rfb1. By setting the resistance Rfb1 to a value represented by a formula of gm1×Zin×Zout, the input impedance Zin can be kept constant.

When the gain control signal CTL is "b", the target gain is controlled to be a value represented by a formula of gm2×Zout, the transconductance gm of the voltage controlled current circuit (common-source amplifier) 101 is controlled to be gm2, and the impedance Zfb of the feedback circuit 104 is controlled to be a resistance Rfb2. By setting the resistance Rfb2 to a value represented by a formula of gm2×Zin×Zout, the input impedance Zin can be kept constant.

When the gain control signal CTL is "c", the target gain is controlled to be a value represented by a formula of gm3×Zout, the transconductance gm of the voltage controlled current circuit (common-source amplifier) 101 is controlled to be gm3, and the impedance Zfb of the feedback circuit 104 is controlled to be a resistance Rfb3. By setting the resistance Rfb3 to a value represented by a formula of gm3×Zin×Zout, the input impedance Zin can be kept constant.

When the gain control signal CTL is "d", the target gain is controlled to be a value represented by a formula of gm4×Zout, the transconductance gm of the voltage controlled current circuit (common-source amplifier) 101 is controlled to be gm4, and the impedance Zfb of the feedback circuit 104 is controlled to be a resistance Rfb4. By setting the resistance Rfb4 to a value represented by a formula of gm4×Zin×Zout, the input impedance Zin can be kept constant.

When the gain control signal CTL is "e", the target gain is controlled to be a value represented by a formula of gm5×Zout, the transconductance gm of the voltage controlled current circuit (common-source amplifier) 101 is controlled to be gm5, and the impedance Zfb of the feedback circuit 104 is controlled to be a resistance Rfb5. By setting the resistance Rfb5 to a value represented by a formula of gm5×Zin×Zout, the input impedance Zin can be kept constant.

Also in this circuit structure, by providing a relationship as shown in FIG. 7 based on the formula (2), when either of the control signals CTL is selected, it is possible to keep the input impedance Zin constant. Accordingly, even when the gain is changed by the control signal CTL, it is possible to keep the input impedance Zin constant, and to prevent the attenuation of the strength of the input signal.

As described above, according to the first to fourth embodiments, the switch control circuit 105 controls the impedance Zfb of the feedback circuit 104 according to the gain of the common-source amplifier 101. In the second and third embodiments, the switch control circuit 105 controls not only the impedance (resistance value or capacitance value, for instance) Zout of the output load 102 but also the impedance (resistance value, for example) Zfb of the feedback circuit 104. In the forth embodiment, the switch control circuit 105 controls not only the transconductance gm of the common-source amplifier 101 but also the impedance (resistance value, for example) Zfb of the feedback circuit 104.

When the gain is varied, by controlling the impedance Zfb of the feedback circuit 104, the input impedance Zin can be kept constant. Accordingly, the impedance matching can be realized, resulting that the attenuation of the input signal can be prevented.

Note that it is possible to realize a communication device capable of preventing the attenuation of the input signal by amplifying a weak radio wave received by an antenna using the amplifier circuit of the above-described embodiments and by demodulating the amplified output.

In such a case, the communication device has an antenna, the aforementioned amplifier circuit, and a demodulation circuit. The above-described amplifier circuit amplifies a signal input from the antenna. The demodulation circuit demodulates the signal amplified in the amplifier circuit.

The communication device of the present embodiments can be applied to a communication circuit of a so-called mobile communication base station or mobile communication mobile station which receives a weak radio wave, a communication circuit of a wireless LAN circuit, and the like, in which it is particularly effective when being used as a communication device for a terrestrial digital broadcast, and the like, to which information is added especially in the amplitude direction.

When the gain is varied, by controlling the impedance of the feedback circuit, the input impedance can be kept constant. Accordingly, the impedance matching can be realized, resulting that the attenuation of the input signal can be prevented.

Note that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:
1. An amplifier circuit, comprising:
    a common-source amplifier;
    an output load connected to an output terminal of said common-source amplifier;
    a buffer circuit connected to the output terminal of said common-source amplifier;
    a feedback circuit connected between an output terminal of said buffer circuit and an input terminal of said common-source amplifier; and a control circuit for controlling an impedance of said feedback circuit in accordance with a gain of said common-source amplifier, wherein said control circuit controls not only a transconductance of said common-source amplifier or an impedance of said output load but also the impedance of said feedback circuit.

2. The amplifier circuit according to claim 1, wherein said control circuit controls a resistance value of said feedback circuit.

3. The amplifier circuit according to claim 1, wherein said control circuit controls a resistance value of said output load.

4. The amplifier circuit according to claim 1, wherein said control circuit controls a capacitance value of said output load.

5. The amplifier circuit according to claim 1, wherein said control circuit controls not only the capacitance value of said output load but also the resistance value of said feedback circuit.

6. The amplifier circuit according to claim 1, wherein said common-source amplifier, comprising:
cascade-connected first and second field effect transistors; and
a switch connected to a gate of said second field effect transistor.

7. The amplifier circuit according to claim 6, wherein said control circuit controls the resistance value of said feedback circuit.

8. A communication device, comprising:
an antenna;
an amplifier circuit for amplifying a signal being input from said antenna; and
a demodulation circuit for demodulating the signal amplified in said amplifier circuit,
wherein said amplifier circuit, comprising:
a common-source amplifier;
an output load connected to an output terminal of said common-source amplifier;
a buffer circuit connected to the output terminal of said common-source amplifier;
a feedback circuit connected between an output terminal of said buffer circuit and an input terminal of said common-source amplifier; and
a control circuit for controlling an impedance of said feedback circuit in accordance with a gain of said common-source amplifier,
wherein said control circuit controls not only a transconductance of said common-source amplifier or an impedance of said output load but also the impedance of said feedback circuit.

* * * * *